United States Patent
Tsuchiya et al.

(10) Patent No.: US 9,472,738 B2
(45) Date of Patent: Oct. 18, 2016

(54) LIGHT EMITTING MEMBER HAVING A WIRING BOARD WITH THROUGH HOLE EXPOSING A LIGHT EMITTING SEMICONDUCTOR ELEMENT WITH A LIGHT REFLECTING MEMBER COVERING A PERIPHERAL WALL PORTION OF THE THROUGH HOLE

(71) Applicant: TOYODA GOSEI CO., LTD., Kiyosu-shi (JP)

(72) Inventors: Yosuke Tsuchiya, Kiyosu (JP); Hiroyuki Tajima, Kiyosu (JP); Shota Shimonishi, Kiyosu (JP); Shigeo Takeda, Kiyosu (JP); Tomohiro Miwa, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 0 days.

(21) Appl. No.: 14/450,132

(22) Filed: Aug. 1, 2014

(65) Prior Publication Data
US 2015/0036349 A1     Feb. 5, 2015

(30) Foreign Application Priority Data

Aug. 5, 2013  (JP) ................... 2013-162469

(51) Int. Cl.
*H01L 33/16*      (2010.01)
*H01L 33/60*      (2010.01)
*H01L 25/075*     (2006.01)
(Continued)

(52) U.S. Cl.
CPC ........... *H01L 33/60* (2013.01); *H01L 25/0753* (2013.01); *H01L 33/644* (2013.01); *H01L 2924/0002* (2013.01); *H05K 1/021* (2013.01);
(Continued)

(58) Field of Classification Search
CPC ..... H01L 33/60; H01L 33/644; H01L 33/64; H01L 33/483; F21Y 2101/02
USPC .......................................................... 362/294
See application file for complete search history.

(56) References Cited

U.S. PATENT DOCUMENTS 6,788,541 B1 *  9/2004  Hsiung ................... G09F 9/33
                                                       257/713
8,258,522 B2    9/2012  Kadotani et al.
(Continued)

FOREIGN PATENT DOCUMENTS

JP   2000-150969 A    5/2000
JP     2011-9298 A    1/2001
(Continued)

OTHER PUBLICATIONS

Japanese Office Action dated May 31, 2016 with an English translation thereof.

*Primary Examiner* — Robert May
(74) *Attorney, Agent, or Firm* — McGinn IP Law Group, PLLC

(57) ABSTRACT

A light emitting device includes a heat dissipation board, a wiring board that is bonded and fixed to the heat dissipation board and formed with a through-hole, a semiconductor light emitting element that is mounted on a face of the heat dissipation board, the face being exposed through the through-hole of the wiring board, and a light reflecting member that covers a portion of an inner peripheral wall surface of the through-hole of the wiring board, the portion being squarely opposed to a side surface of the semiconductor light emitting element.

18 Claims, 4 Drawing Sheets

(51) Int. Cl.
*H01L 33/64* (2010.01)
*H05K 1/02* (2006.01)
*H05K 3/28* (2006.01)
(52) U.S. Cl.
CPC ............ *H05K 1/0209* (2013.01); *H05K 3/284* (2013.01); *H05K 2201/10106* (2013.01)

(56) References Cited

U.S. PATENT DOCUMENTS

| | | | |
|---|---|---|---|
| 2003/0032212 A1* | 2/2003 | Wang | H01L 33/60 438/48 |
| 2003/0116769 A1* | 6/2003 | Song | H01L 25/0753 257/79 |
| 2011/0108865 A1* | 5/2011 | Aldaz | H01L 33/60 257/98 |
| 2011/0241041 A1* | 10/2011 | Greenwood | H01L 33/647 257/94 |
| 2012/0074444 A1* | 3/2012 | Chen | F21K 9/90 257/98 |
| 2012/0302124 A1* | 11/2012 | Imazu | H01L 33/486 445/58 |

FOREIGN PATENT DOCUMENTS

| | | |
|---|---|---|
| JP | 2007-109701 A | 4/2007 |
| WO | WO 2009/075530 A2 | 6/2009 |
| WO | WO 2009/119461 A1 | 10/2009 |

* cited by examiner

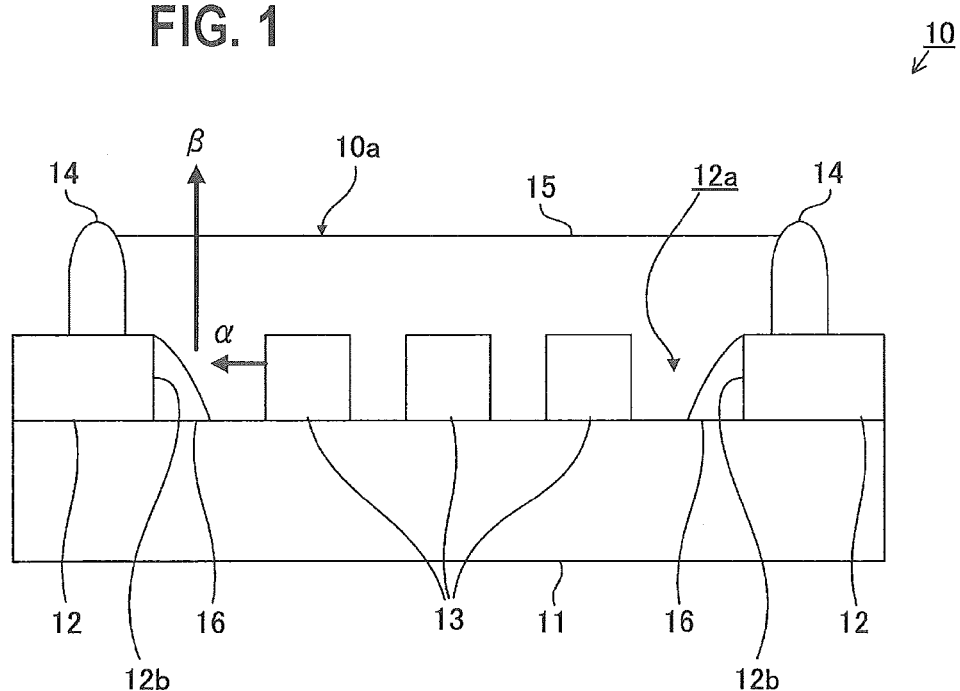
FIG. 1
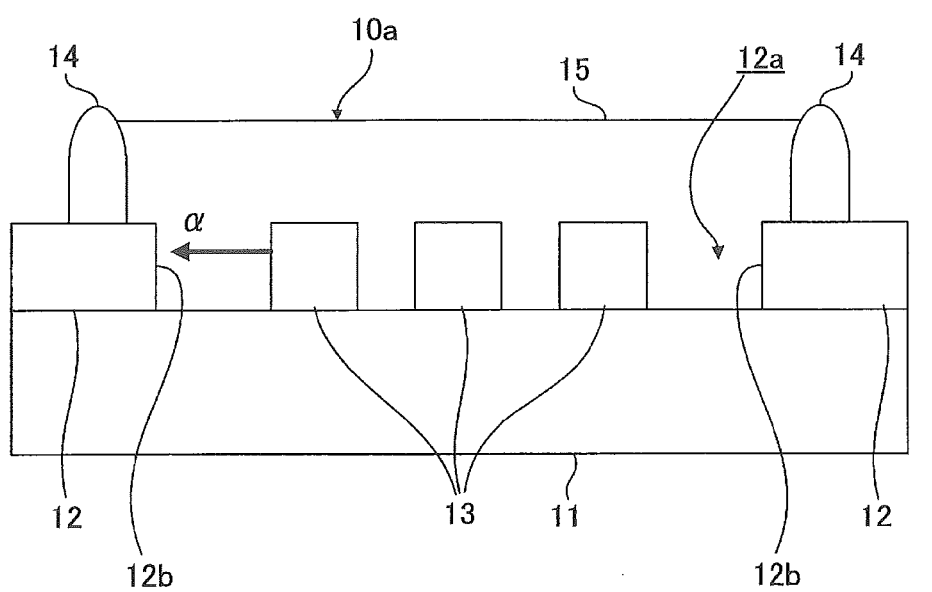
FIG. 2 -- Related Art --

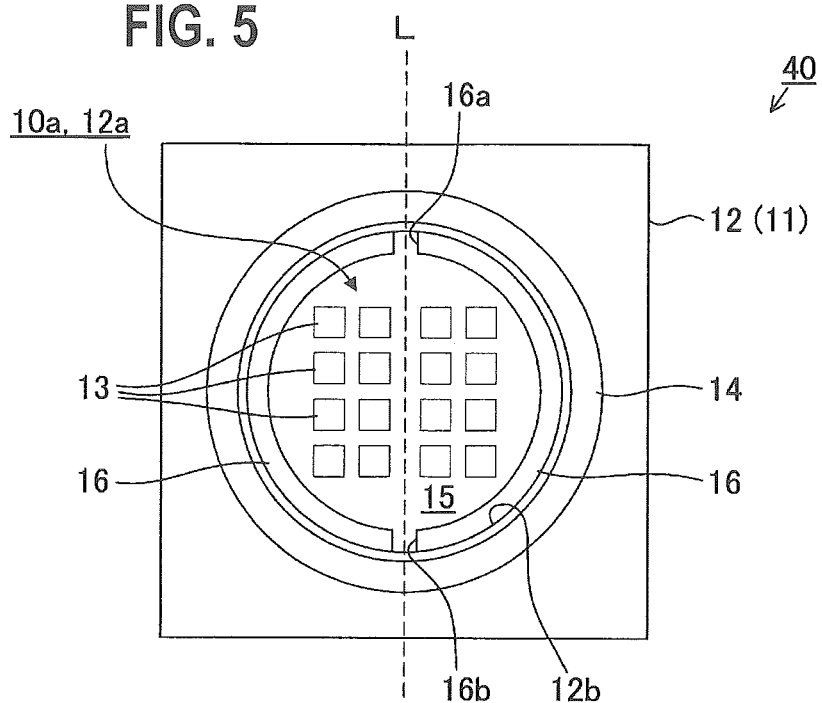
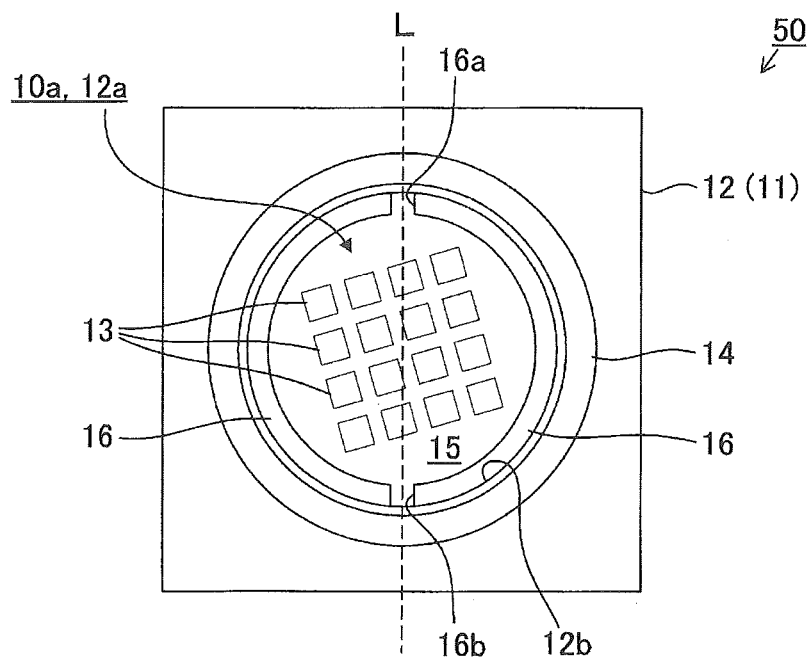

LIGHT EMITTING MEMBER HAVING A WIRING BOARD WITH THROUGH HOLE EXPOSING A LIGHT EMITTING SEMICONDUCTOR ELEMENT WITH A LIGHT REFLECTING MEMBER COVERING A PERIPHERAL WALL PORTION OF THE THROUGH HOLE

CROSS-REFERENCE TO RELATED APPLICATIONS

This application claims the benefit of Japanese Patent Application No. 2013-162469 (filed on Aug. 5, 2013), the entire contents of which are hereby incorporated by reference.

BACKGROUND

1. Technical Field

The present invention relates to a light emitting device and, more particularly, to a light emitting device including a semiconductor light emitting element.

2. Related Art

JP-A-2007-109701 discloses a board for mounting a light emitting element, having a structure in which a wiring plate and a supporting member are bonded to each other. Here, the wiring plate is provided with a through-hole for passing the reflected light from the supporting member mounted with the light emitting element and the light emitting element is mounted on the supporting member at a position immediately below the through-hole.

JP-A-2011-009298 discloses a light-emitting diode light source which includes a base with thermal conductivity, an insulating plate having conductive patterns on the surface thereof and fixed to the surface of the base and a plurality of light-emitting diode elements mounted on mounting areas of the surface of the base that are exposed by a through-hole provided on the insulating plate.

In the technique disclosed in JP-A-2007-109701, the side surface of the light emitting element and the inner peripheral wall surface of the through-hole of the wiring board are opposed to each other and therefore the light emitted from the side surface of the light emitting element is absorbed by the inner peripheral wall surface of the through-hole of the wiring board. Accordingly, there is a problem that the light extraction efficiency is degraded.

Further, in the technique disclosed in JP-A-2011-009298, the side surface of the light-emitting diode element and the inner peripheral wall surface of the through-hole of the insulation plate are opposed to each other and therefore the light emitted from the side surface of the light-emitting diode element is absorbed by the inner peripheral wall surface of the through-hole of the insulating plate. Accordingly, there is a problem that the light extraction efficiency is degraded.

The present invention has been made to solve the above problems and an object thereof is to provide a light emitting device which is capable of improving the light extraction efficiency.

SUMMARY

The present inventors have studied to solve the above problems and, as a result, have conceived each aspect of the present invention as described below.

First Aspect

In the first aspect, a light emitting device includes a heat dissipation board, a wiring board that is bonded and fixed to the heat dissipation board and formed with a through-hole, a semiconductor light emitting element that is mounted on a face of the heat dissipation board, the face being exposed through the through-hole of the wiring board, and a light reflecting member that covers a portion of an inner peripheral wall surface of the through-hole of the wiring board, the portion being squarely opposed to a side surface of the semiconductor light emitting element.

In the first aspect, the light emitted from the side surface of the semiconductor light emitting element is irradiated to the light reflecting member to cover the inner peripheral wall surface of the through-hole of the wiring board, reflected by the light reflecting member and then emitted to the outside from the opening side of the through-hole of the wiring board.

As a result, according to the first aspect, the light emitted from the side surface of the semiconductor light emitting element can be prevented from being absorbed by the inner peripheral wall surface of the through-hole of the wiring board. Accordingly, it is possible to improve the light extraction efficiency.

Meanwhile, the light absorption by the inner peripheral wall surface of the through-hole can be completely prevented when the whole inner peripheral wall surface of the through-hole of the wiring board is covered with the light reflecting member.

However, the light emitted from the side surface of the semiconductor light emitting element is not directly irradiated to the portion of the inner peripheral wall surface of the through-hole of the wiring board, which is not squarely opposed to the side surface of the semiconductor light emitting element.

For this reason, when, as in the first aspect, the light reflecting member covers the portion of the inner peripheral wall surface of the through-hole of the wiring board, which is squarely opposed to the side surface of at least the semiconductor light emitting element, the light emitted from the side surface of the semiconductor light emitting element is hardly absorbed in the portion of the inner peripheral wall surface of the through-hole that is exposed from the light reflecting member. As a result, it is possible to obtain sufficient light extraction efficiency.

Second Aspect

In the light emitting device of the first aspect, fine particles of a material having high light reflectivity are dispersed in the light reflecting member.

According to the second aspect, it is possible to easily enhance the light reflectivity of the light reflecting member. Accordingly, it is possible to securely obtain the operation/effect of the first aspect.

Third Aspect

In the light emitting device of the first aspect or the second aspects, fine particles of a material having high thermal conductivity are dispersed in the light reflecting member.

According to the third aspect, the thermal conductivity of the light reflecting member can be easily enhanced and the heat generated in the light reflecting member can be efficiently dissipated by the light irradiated from the semiconductor light emitting element. As a result, it is possible to prevent the deterioration of the components of the light emitting device due to overheating of the light reflecting member.

Fourth Aspect

In the light emitting device of any one of the first to third aspects, the surface of the light reflecting member is formed as an inclined surface having a shape which spreads toward the opening side of the through-hole of the wiring board.

In the fourth aspect, the light reflecting member functions as a reflector and the emitted light of the semiconductor light emitting element can be irradiated in one direction from the opening side of the through-hole of the wiring board. Accordingly, it is possible to further improve the light extraction efficiency.

Fifth Aspect

In the light emitting device of any one of the first to fourth aspects, the light reflecting member is disposed to surround the through-hole at the surface of the wiring board.

In the fifth aspect, the semiconductor light emitting element can be encapsulated in the encapsulant by injecting and filling the encapsulant in the portion surrounded by the light reflecting member.

Specifically, in the fifth aspect, the light reflecting member is also able to serve as the frame for injecting and filing the encapsulant and therefore it is not necessary to form separately the frame and the light reflecting member. As a result, the manufacturing process is simplified and therefore the manufacturing cost can be reduced.

Sixth Aspect

The light emitting device of any one of the first to fifth aspects further includes a protrusion member that is provided at a site on the surface of the heat dissipation board that is exposed through the through-hole of the wiring board so as to be opposed to the inner peripheral wall surface of the through-hole and adjacent to the light reflecting member.

In the sixth aspect, the protrusion member functions as a levee to stop the outflow of the light reflecting member. As a result, the light reflecting member applied to the inner peripheral wall surface of the through-hole of the wiring board can be prevented from flowing out onto the heat dissipation board and therefore the inner peripheral wall surface of the through-hole of the wiring board can be securely covered with the light reflecting member.

BRIEF DESCRIPTION OF THE DRAWINGS

FIG. 1 is a longitudinal sectional view showing a schematic configuration of a light emitting device 10 of a first embodiment embodying the present invention.

FIG. 2 is a longitudinal sectional view showing a schematic configuration of a light emitting device 100 in the related art.

FIG. 5 is a plan view showing a schematic configuration of a light emitting device 40 of a fourth embodiment embodying the present invention.

FIG. 6 is a plan view showing a schematic configuration of a light emitting device 50 of a fifth embodiment embodying the present invention.

DETAILED DESCRIPTION

Figure 3:
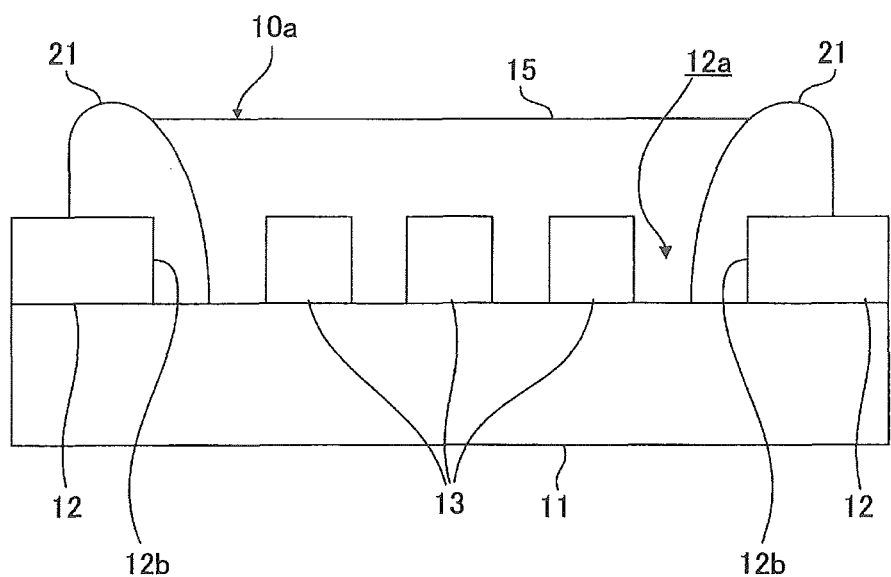
FIG. 3 is a longitudinal sectional view showing a schematic configuration of a light emitting device 20 of a second embodiment embodying the present invention.

Hereinafter, each of the embodiments embodying the present invention will be described with reference to the accompanying drawings. In each of the embodiments, the same parts and components are denoted by the same reference numerals and a duplicated description thereof will be omitted.

Further, in each of the drawings, for the purpose of facilitating understanding, the size, shape and arrangement of the components in each of the embodiments are schematically shown in an exaggerated manner. Further, the size, shape and arrangement of the components are different from the actual.

First Embodiment

As shown in FIG. 1, the light emitting device 10 of the first embodiment includes a heat dissipation board 11, a wiring board 12 (a through-hole 12a and an inner peripheral wall surface 12b), LED (Light Emitting Diode) chips 13, a frame 14, an encapsulant 15, a light reflecting member 16 and a light radiating surface 10a.

The heat dissipation board (support, base) 11 is formed by a flat plate of a metal material (e.g., aluminum alloy, pure copper, copper-based alloy, etc.) with high thermal conductivity.

The wiring board (wiring plate, insulating plate, insulating layer) 12 is bonded and fixed on a surface of the heat dissipation board 11. The wiring board 12 is foil led with the through-hole 12a.

In addition, the wiring board 12 is formed by a composite board (e.g., a glass epoxy board, a paper phenolic board, etc.) of a synthetic resin material (e.g., epoxy resin, phenolic resin, etc.) with high insulating properties and a base material (e.g., glass fiber, paper, etc.) or a flat plate of a ceramic material (e.g., aluminum nitride, etc.), or the like.

Further, a wiring pattern (not shown) made of copper foil is formed on the surface (i.e., the surface opposite to the surface that is bonded and fixed to the heat dissipation board 11) of the wiring board 12. The wiring pattern is covered with a solder resist layer (not shown) that is formed on the surface of the wiring board 12.

The LED chip 13 is a bare chip having a substantially rectangular parallelepiped shape. On the surface of the heat dissipation board 11 that is exposed through the through-hole 12a, a plurality of LED chips 13 is mounted/carried by COB (Chip on Board) method.

In FIG. 1, three of the plurality of LED chips 13 are shown.

Further, each of the LED chips 13 is wired/connected to each other by a bonding wire (not shown) and is wired/connected to a wiring pattern (not shown) of the wiring board 12 via a bonding wire (not shown).

The frame 14 is provided on the surface of the wiring board 12 so as to surround the through-hole 12a of the wiring board 12.

In addition, the frame 14 is formed by a white synthetic resin material (e.g., silicone resin, epoxy resin, etc.) in which light-reflective fine particles (e.g., titanium oxide, aluminum oxide, boron nitride, aluminum nitride, barium sulfate, etc.) are dispersed, a light-reflective ceramic material (e.g., aluminum oxide, etc.), a light-reflective metallic material (e.g., aluminum alloy, etc.), or the like.

The encapsulant 15 is injected and filled in the frame 14. Each LED chip 13 and the light reflecting member 16 are embedded in the encapsulant 15 by being encapsulated in the encapsulant 15.

In addition, the encapsulant 15 is formed by a transparent synthetic resin material (e.g., silicone resin, etc.) that contains a phosphor (e.g., YAG (Yttrium Aluminum Garnet) based, etc.).

Here, the surface of the encapsulant 15 is a light radiating surface (a light radiating region, a light emitting region, a light emitting part) 10a of the light emitting device 10.

The light reflecting member 16 is formed on the surface of the heat dissipation board 11 so as to cover the whole inner peripheral wall surface 12b of the through-hole 12a of the wiring board 12.

Further, the surface of the light reflecting member 16 is formed as an inclined surface having a shape which spreads toward the opening side of the through-hole 12a.

Meanwhile, the light reflecting member 16 is formed by a white synthetic resin material (e.g., silicone resin, epoxy resin, etc.) with low thermal expansion, in which fine particles of a material (e.g., titanium oxide, aluminum oxide, boron nitride, aluminum nitride, barium sulfate, etc.) with high light reflectivity and fine particles of a material (e.g., aluminum, silver, copper, etc.) with high thermal conductivity are dispersed.

A method of forming the light reflecting member 16 includes a dispense (potting) method, a screen printing method and the like, for example.

By the way, in the case of using the screen printing method, it is necessary to mount each LED chip 13 on the heat dissipation board 11 after forming the light reflecting member 16.

Operation and Effect of First Embodiment

According to the light emitting device 10 of the first embodiment, the following operation/effect can be obtained.

[1] As shown in FIG. 2, in the light emitting device 100 of the related art, the light reflecting member 16 is not provided and therefore the inner peripheral wall surface 12b of the through-hole 12a of the wiring board 12 is exposed.

Therefore, as shown by an arrow α in FIG. 2, the light emitted from the side surface of each LED chip 13 is absorbed by the inner peripheral wall surface 12b of the through-hole 12a of the wiring board 12. As a result, there is a problem that the light extraction efficiency is degraded.

In contrast, in the light emitting device 10, the light emitted from the side surface of each LED chip 13 is irradiated on the light reflecting member 16 which covers the whole inner peripheral wall surface 12b of the through-hole 12a of the wiring board 12, as shown by an arrow α in FIG. 1. Then, the light is reflected by the light reflecting member 16 and emitted to the outside from the opening side of the through-hole 12a of the wiring board 12, as shown by an arrow β in FIG. 1.

As a result, according to the light emitting device 10, the light emitted from the side surface of each LED chip 13 can be prevented from being absorbed by the inner peripheral wall surface 12b of the through-hole 12a of the wiring board. Accordingly, it is possible to improve the light extraction efficiency.

[2] Since the fine particles of the material with high light reflectivity are dispersed in the light reflecting member 16, it is possible to easily increase the light reflectivity of the light reflecting member 16. In this way, the operation/effect of the [1] can be securely achieved.

[3] Since the fine particles of the material with high thermal conductivity are dispersed in the light reflecting member 16, it is possible to easily increase the thermal conductivity of the light reflecting member 16. Further, since the heat generated in the light reflecting member 16 is efficiently dissipated by the light irradiated from each LED chip 13, it is possible to prevent the deterioration of the components (the wiring board 12, the LED chips 13, the frame 14, the encapsulant 15, etc.) of the light emitting device 10 due to overheating of the light reflecting member 16.

[4] Since the surface of the light reflecting member 16 is formed as an inclined surface having a shape which spreads toward the opening side of the through-hole 12a of the wiring board 12, the light reflecting member 16 functions as a reflector. As a result, the emitted light of each LED chip 13 can be irradiated in one direction from the opening side of the through-hole 12a of the wiring board. Accordingly, it is possible to further improve the light extraction efficiency.

[5] Since the light reflecting member 16 is fainted by a synthetic resin material with low thermal expansion, the bonding wire can be prevented from being adversely affected by the thermal expansion of the light reflecting member 16 even when the bonding wire (not shown) connecting/wiring each LED chip 13 is stretched over the light reflecting member 16.

[6] Although the light reflecting member 16 is embedded in the encapsulant 15 by being encapsulated in the encapsulant 15, the light emitted from the side surface of each LED chip 13 is totally reflected by an air layer even when the encapsulant 15 is separated from the light reflecting member 16 and the air layer (void) occurs between the light reflecting member 16 and the encapsulant 15. Accordingly, the light extraction efficiency is not degraded by the air layer.

Second Embodiment

As shown in FIG. 3, the light emitting device 20 of the second embodiment includes the heat dissipation board 11, the wiring board 12 (the through-hole 12a and the inner peripheral wall surface 12b), the LED chips 13, the frame 14, the encapsulant 15, the light radiating surface 10a and a light reflecting member 21.

The light emitting device 20 of the second embodiment is different from the light emitting device 10 of the first embodiment only in the fact that the light emitting device 20 includes the light reflecting member 21 which is made by integrating the frame 14 and the light reflecting member 16 of the light emitting device 10.

In addition to being formed on the surface of the heat dissipation board 11 so as to cover the whole inner peripheral wall surface 12b of the through-hole 12a of the wiring board 12, the light reflecting member 21 is formed on the surface of the wiring board 12 so as to surround the through-hole 12a of the wiring board 12.

Further, the encapsulant 15 is injected and filled in the portion surrounded by the light reflecting member 21.

Moreover, the inner peripheral wall surface of the light reflecting member 21 is formed as an inclined surface having a shape which spreads toward the opening side of the light reflecting member 21.

Here, the material and forming method of the light reflecting member 21 are the same as the light reflecting member 16 of the first embodiment.

Therefore, according to the second embodiment, it is possible to obtain the same operation/effect as the first embodiment.

Further, in the second embodiment, the light reflecting member 21 also serves as the frame 14 of the first embodiment. Accordingly, it is not necessary to form separately the frame 14 and the light reflecting member 16, unlike the first embodiment. As a result, the manufacturing process is simplified and therefore the manufacturing cost can be reduced.

Third Embodiment

Figure 4A:
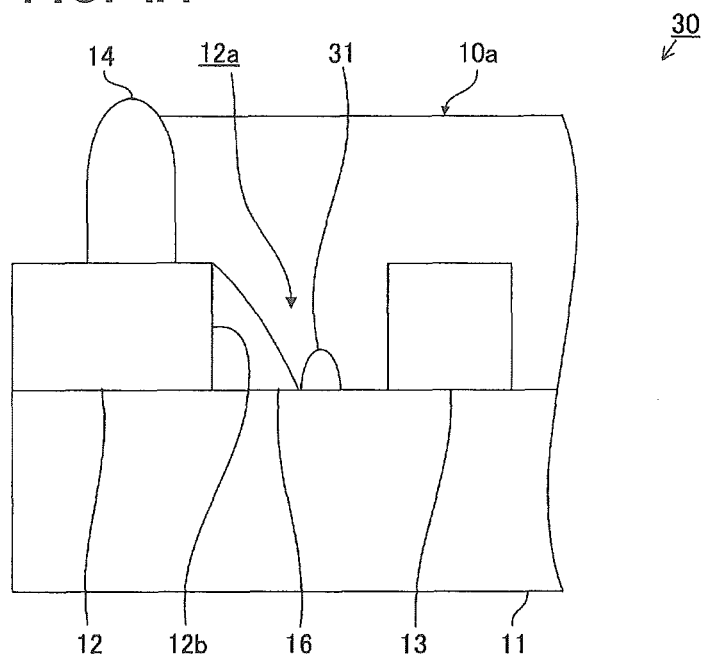
FIG. 4A is a longitudinal sectional view showing a schematic configuration of main parts of a light emitting device 30 of a third embodiment embodying the present invention and FIG. 4B is a longitudinal sectional view showing a schematic configuration of main parts of the light emitting device 10 of the first embodiment.

As shown in FIG. 4A, the light emitting device 30 of the third embodiment includes the heat dissipation board 11, the wiring board 12 (the through-hole 12a and the inner peripheral wall surface 12b), the LED chips 13, the frame 14, the encapsulant 15, the light reflecting member 16, the light radiating surface 10a and a protrusion member 31.

The light emitting device 30 of the third embodiment is different from the light emitting device 10 of the first embodiment only in the fact that the light emitting device 30 is provided with the protrusion member 31.

Therefore, according to the third embodiment, it is possible to obtain the same operation/effect as the first embodiment.

Further, on the surface of the heat dissipation board 11 that is exposed through the through-hole 12a of the wiring board 12, the protrusion member 31 is formed at a site which is opposed to the inner peripheral wall surface 12b of the through-hole 12a of the wiring board 12 and adjacent to the light reflecting member 16.

Figure 4B:
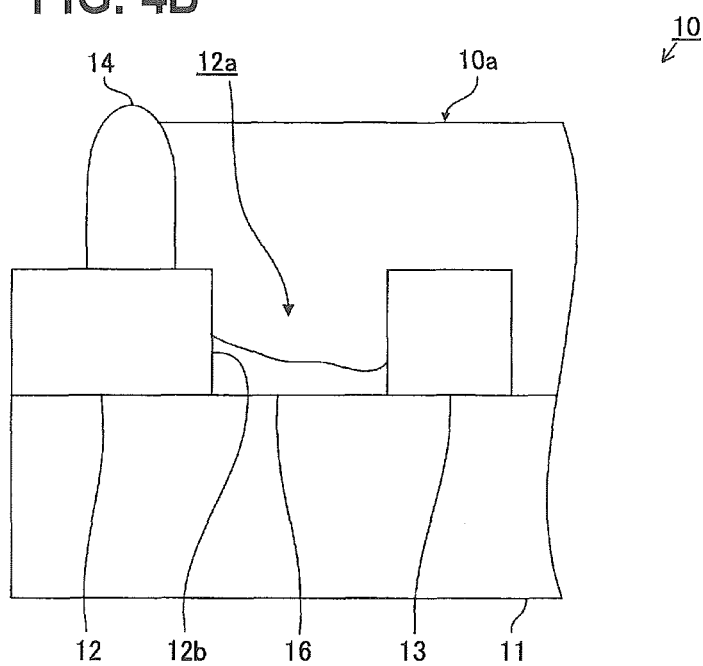

As shown in FIG. 4B, in the light emitting device 10 of the first embodiment, there is a possibility that the light reflecting member 16 applied to the inner peripheral wall surface 12b of the through-hole 12a of the wiring board 12 flows out onto the heat dissipation board 11 and therefore only a portion of the inner peripheral wall surface 12b is covered when the light reflecting member 16 is formed by using a dispense method.

In contrast, as shown in FIG. 4A, in the light emitting device 30 of the third embodiment, the protrusion member 31 functions as a levee to stop the outflow of the light reflecting member 16. As a result, the light reflecting member 16 applied to the inner peripheral wall surface 12b of the through-hole 12a of the wiring board 12 can be prevented from flowing out onto the heat dissipation board 11 and therefore the whole inner peripheral wall surface 12b of the through-hole 12a of the wiring board 12 can be securely covered with the light reflecting member 16.

Fourth Embodiment

As shown in FIG. 5, the light emitting device 40 of the fourth embodiment includes the heat dissipation board 11, the wiring board 12 (the through-hole 12a and the inner peripheral wall surface 12b), the LED chips 13, the frame 14, the encapsulant 15, the light reflecting member 16, the light radiating surface 10a and cut parts 16a, 16b of the light reflecting member 16.

The light emitting device 40 of the fourth embodiment is different from the light emitting device 10 of the first embodiment only in the fact that the light reflecting member 16 is provided with two cut parts 16a, 16b.

In the light emitting device 40 of the fourth embodiment, the heat dissipation board 11 and the wiring board 12 have a rectangular flat plate shape, respectively. The through-hole 12a of the wiring board 12 has a circular shape and the frame 14 has a circular frame shape (a doughnut shape).

On the surface of the heat dissipation board 11 exposed through the through-hole 12a of the wiring board 12, each LED chip 13 is arranged side by side in a grid-like shape with intervals therebetween.

The light reflecting member 16 of the fourth embodiment is formed by using a screen printing method. The light reflecting member 16 is formed with two cut parts 16a, 16b that are located at positions corresponding to the joint of a screen plate.

Specifically, the light reflecting member 16 is vacant at each of cut parts 16a, 16b of the light reflecting member 16 and the inner peripheral wall surface 12b of the through-hole 12a of the wiring board 12 is exposed from each of the cut parts 16a, 16b.

Each LED chip 13 is not disposed on the straight line L connecting each of the cut parts 16a, 16b of the light reflecting member 16. The side surface of each LED chip 13 and each of the cut parts 16a, 16b are not squarely opposed to each other.

Specifically, the light reflecting member 16 is adapted to cover the portion of the inner peripheral wall surface 12b of the through-hole 12a of the wiring board 12, which is squarely opposed to the side surface of at least each LED chip 13.

Here, the light emitted from the side surface of each LED chip 13 is not directly irradiated on the portion of the inner peripheral wall surface 12b of the through-hole 12a of the wiring board 12, which is not squarely opposed to the side surface of each LED chip 13.

Therefore, the light emitted from the side surface of each LED chip 13 is not directly irradiated to each of the cut parts 16a, 16b of the light reflecting member 16 and also hardly absorbed in the inner peripheral wall surface 12b of the through-hole 12a of the wiring board 12 exposed through each of the cut parts 16a, 16b. As a result, it is possible to obtain sufficient light extraction efficiency.

Accordingly, also in the fourth embodiment, the operation/effect of the [1] of the first embodiment is not hindered and therefore it is possible to obtain the same operation/effect as the first embodiment.

Fifth Embodiment

As shown in FIG. 6, the light emitting device 50 of the fifth embodiment includes the heat dissipation board 11, the wiring board 12 (the through-hole 12a and the inner peripheral wall surface 12b), the LED chips 13, the frame 14, the encapsulant 15, the light reflecting member 16, the light radiating surface 10a and cut parts 16a, 16b of the light reflecting member 16.

The light emitting device 50 of the fifth embodiment is different from the light emitting device 40 of the fourth embodiment only in the positional relationship between each of the cut parts 16a, 16b of the light reflecting member 16 and each LED chip 13.

In the fifth embodiment, a straight line L connecting each of the cut parts 16a, 16b of the light reflecting member 16 is not orthogonal to the side surface of each LED chip 13.

Specifically, the light reflecting member 16 is adapted to cover the portion of the inner peripheral wall surface 12b of the through-hole 12a of the wiring board 12, which is squarely opposed to the side surface of at least each LED chip 13.

Therefore, also in the fifth embodiment, the light emitted from the side surface of each LED chip 13 is not directly irradiated to each of the cut parts 16a, 16b of the light reflecting member 16 and also hardly absorbed in the inner peripheral wall surface 12b of the through-hole 12a of the wiring board 12 exposed through each of the cut parts 16a, 16b. As a result, it is possible to obtain the same operation/effect as the fourth embodiment.

Other Embodiments

The present invention is not limited to each of the embodiments but may be embodied as follows. Even in these cases, it is possible to obtain the operation/effect that is equal to or better than each of the embodiments.

[A] The LED chip 13 may be replaced with any semiconductor light emitting element (e.g., an organic EL chip, etc.).

[B] The heat dissipation board 11 is not limited to the metallic material but may be formed by any material (e.g., a synthetic resin material, a ceramic material, etc.) with high thermal conductivity.

[C] The present invention may be implemented by appropriately combining each of the embodiments. In this case, the operation/effect of the combined embodiments can be additionally obtained or synergy effects can be obtained.

The present invention is not intended to be limited to the descriptions of each of the aspects and each of the embodiments. Various modifications in the range that can be easily conceived by those skilled in the art without departing from the description of the claims are also included in the present invention. The contents of the publications disclosed in this specification are incorporated herein by reference in its entirety.

What is claimed is:

1. A light emitting device comprising:
   a heat dissipation board;
   a wiring board that is bonded and fixed to the heat dissipation board and formed with a through-hole;
   a semiconductor light emitting element that is mounted on a face of the heat dissipation board, the face being exposed through the through-hole of the wiring board; and
   a light reflecting member that covers a portion of an inner peripheral wall surface of the through-hole of the wiring board, the portion being parallel to a side surface of the semiconductor light emitting element,
   wherein a surface of the light reflecting member includes an inclined surface,
   wherein fine particles of a material having high light reflectivity are dispersed in the light reflecting member.

2. The light emitting device according to claim 1, wherein fine particles of a material having high thermal conductivity are dispersed in the light reflecting member.

3. The light emitting device according to claim 1, wherein the surface of the light reflecting member including the inclined surface has a shape which spreads toward an opening side of the through-hole of the wiring board.

4. The light emitting device according to claim 1, wherein the light reflecting member is disposed to surround the through-hole at a surface of the wiring board.

5. The light emitting device according to claim 1, further comprising:
   a protrusion member that is provided at a site on a surface of the heat dissipation board that is exposed through the through-hole of the wiring board so as to be opposed to the inner peripheral wall surface of the through-hole and adjacent to the light reflecting member.

6. The light emitting device according to claim 1, wherein an edge of the inclined surface of the light reflecting member contacts an edge of the wiring board.

7. The light emitting device according to claim 1, wherein the inclined surface of the light reflecting member inclines from a point between the semiconductor light emitting element to an edge of the wiring board.

8. The light emitting device according to claim 1, wherein the inclined surface of the light reflecting member does not protrude beyond the through-hole.

9. The light emitting device according to claim 1, wherein a height of the inclined surface of the light reflecting member is equal to a height of the through-hole.

10. The light emitting device according to claim 1, wherein a height of the inclined surface of the light reflecting member is equal to a height of the wiring board.

11. The light emitting device according to claim 1, wherein a height of the inclined surface of the light reflecting member is not equal to a height of the through-hole.

12. The light emitting device according to claim 1, wherein a height of the inclined surface of the light reflecting member is not equal to a height of the wiring board.

13. The light emitting device according to claim 1, further comprising a protrusion member disposed on the heat dissipation board between the light reflecting member and the semiconductor light emitting element.

14. The light emitting device according to claim 1, further comprising a protrusion member disposed on the heat dissipation board between the light reflecting member and the semiconductor light emitting element, the protrusion member being closer to the light reflecting member than the semiconductor light emitting element.

15. The light emitting device according to claim 1, wherein the inclined surface of the light reflecting member is concave.

16. The light emitting device according to claim 1, wherein the inclined surface of the light reflecting member is non-linear.

17. The light emitting device according to claim 1, wherein the light reflecting member contacts the wiring board and the semiconductor light emitting element.

18. The light emitting device according to claim 1, further comprising a frame is integrally formed with the light reflecting member.

* * * * *